(12) United States Patent
Kizuki et al.

(10) Patent No.: US 6,506,618 B1
(45) Date of Patent: Jan. 14, 2003

(54) METHOD OF FORMING A GAINNAS LAYER

(75) Inventors: Hirotaka Kizuki, Tokyo (JP); Yasutomo Kajikawa, Shimane (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/150,008

(22) Filed: May 20, 2002

(30) Foreign Application Priority Data

Nov. 19, 2001 (JP) ........................................ 2001-352842

(51) Int. Cl.⁷ ............................................... H01L 21/20
(52) U.S. Cl. .......................................... 438/47; 438/930
(58) Field of Search ............................ 438/47, 46, 572, 438/761, 763, 930

(56) References Cited

U.S. PATENT DOCUMENTS 6,358,822 B1 * 3/2002 Tomomura .................. 438/483

OTHER PUBLICATIONS

Copel, M. et al., "Illustrated Description" of Thin–Film Technique, Phys. Rev. Lett. 63,632 (1989), pp. 105–108.
Storm et al., "Surfactant Effects Of Thallium In The Epitaxial Growth Of Indium Arsenide On Gallium Arsenide (001)", Journal of Applied Physics, vol. 85, No. 9, May 1999, pp. 6838–6842.
Yang et al., "Low Threshold InGaAsN/GaAs Single Quantum Well Lasers Grown By Molecular Beam Epitaxy Using Sb Surfactant", Electronics Letters, vol. 35, No. 13, Jun. 1999, pp. 1082–1083.

* cited by examiner

Primary Examiner—Richard Elms
Assistant Examiner—Beth E. Owens
(74) Attorney, Agent, or Firm—Leydig, Voit & Mayer, Ltd.

(57) ABSTRACT

An undoped GaAs layer is formed on a GaAs substrate. Thallium is adhered to the undoped GaAs layer to a thickness of at least one atomic layer. After adhesion of thallium, GaInNAs is epitaxially grown on the undoped GaAs layer by chemical vapor deposition.

16 Claims, 7 Drawing Sheets

| | | |
|---|---|---|
| 50nm, 2E18cm$^{-3}$ | n-GaAs contact layer | 40 |
| 30nm | undoped AlGaAs schottky layer | 39 |
| 7nm, 6E17cm$^{-3}$ | n-AlGaAs electron supply layer | 38 |
| 3nm | undoped AlGaAs spacer layer | 37 |
| 12nm | undoped GaInNAs channel layer | 36 |
| 3nm | undoped AlGaAs spacer layer | 35 |
| 3nm, 6E17cm$^{-3}$ | n-AlGaAs electron supply layer | 34 |
| 200nm | undoped AlGaAs buffer layer | 33 |
| 500nm | undoped GaAs buffer layer | 32 |
| | S.I.-GaAs sub. | 31 |

| | | |
|---|---|---|
| 50nm, 1E19cm$^{-3}$ | n$^\pm$InGaAs contact layer | 58 |
| 100nm, 5E18cm$^{-3}$ | n$^+$-GaAs cap layer | 57 |
| 50nm, 4E17cm$^{-3}$ | n-AlGaAs emitter layer | 56 |
| 60nm, 4E19cm$^{-3}$ | p$^+$-GaInNAs base layer | 55 |
| 300nm, 7E16cm$^{-3}$ | n$^-$-GaAs collector layer | 54 |
| 100nm, 5E18cm$^{-3}$ | n$^+$-GaAs sub-collector layer | 53 |
| 500nm | undoped GaAs buffer layer | 52 |
| | S.I.-GaAs sub. | 51 | ered
METHOD OF FORMING A GAINNAS LAYER

BACKGROUND OF THE INVENTION

1. Field of the Invention

The present invention relates to a semiconductor device and method of manufacturing the semiconductor device, and more articularly, to a GaInNAs-based semiconductor device and a method of manufacturing the GaInNAs-based semiconductor device.

2. Description of the Background Art

A quantum leap has recently been made in the volume of information transmitted over the Internet, and an improvement in transmission speed is an urgent challenge to be met. Trunk optical fiber communication has currently achieved a transmission speed of Class 10 Gbit/s. However, the transmission speeds of subscriber systems have become a bottleneck, and the real state is that browsing a home page is time-consuming. At the dawn of an era of full-fledged broadband communication, a further improvement in the transmission speeds of the subscriber systems, the so-called "last-one-mile," has been zoomed in on as an indispensable requirement.

Two potent measures are available for improving the transmission speeds of subscriber systems; that is, (1) upgrading of an optical fiber network for subscribers, and (2) building of point-to-multipoint communication utilizing a millimeter wave/quasi-millimeter wave. A semiconductor laser producing light having a wavelength of about 1.3 $\mu$m is a key device for optical fiber communication, and a monolithic microwave integrated circuit (MMIC) for transmission/receiving purposes is a key device for millimeter-wave/quasi-millimeter-wave communication. Accordingly, an improvement in the performance of the semiconductor devices (i.e., the semiconductor laser and MMIC) and a great reduction in the costs of the semiconductor devices are indispensable for proliferating the optical fiber network for subscribers and point-to-multipoint communication.

An InGaAsP laser formed on an InP substrate or an InGaAs/AlGaAs strained quantum well laser formed on a GaAs substrate has recently been utilized as a light source for optical fiber communication.

The InGaAsP laser has a problem of an operating current increasing abruptly with an increase in temperature; that is, a problem of a so-called vicious temperature characteristic. The reason for this is that the InGaAsP-based semiconductor layer fails to ensure a large amount of band discontinuity existing between a well layer and a barrier layer, and is that the bandgap of the semiconductor laser has great temperature dependence. Accordingly, use of the InGaAsP laser involves a necessity for use of an additional temperature controller, thus rendering the communications system expensive. As mentioned previously, realization of a subscriber optical communication system requires development of a low-price system which does not involve use of a temperature controller.

In contrast with the InGaAsP laser, the InGaAs/AlGaAs strained quantum well laser ensures the existence of a large amount of band discontinuity between the well layer and the barrier layer, and hence the bandgap of the quantum well laser has low temperature dependence. Accordingly, the quantum well laser has a superior temperature characteristic, thus obviating the need for a temperature controller. An increase in a composition ratio of In results in a problem of an increase in the difference between a lattice constant of InGaAs and that of AlGaAs. Hence, there cannot be obtained a high-quality crystal, and a laser producing light having a wavelength of about 1.3 $\mu$m used in optical communication has not been formed thus far.

To solve the problem, attention has recently been focused on a new compound crystal semiconductor called GaInNAs. A bandgap corresponding to 1.3 $\mu$m to 1.5 $\mu$m is realized by means of adding a trace amount (1% through 5%) of nitrogen (N) to InGaAs. Use of InGaAs for a well layer and use of GaNAs or GaAs for an optical confinement or barrier layer enables a sufficient amount of band discontinuity. A semiconductor laser which obviates a need for temperature control can be realized. A large-diameter, low-cost GaAs substrate can be used in lieu of an expensive InP substrate. Hence, in addition to obviating a necessity of a temperature controller, use of the low-cost GaAs substrate brings an expectation for a significant decrease in the cost of a communication system.

However, GaInNAs is susceptible to three-dimensional island-shaped growth, thus posing a difficulty in fabricating a quantum well structure having a flat interface. For this reason, there has been available only a report about a laser having a high oscillation threshold value (threshold-value current), and the problem poses a barrier against practical use of GaInNa.

SUMMARY OF THE INVENTION

The present invention has been conceived to solve the previously-mentioned problems and aims at causing a good-quality GaInNAs crystal to grow on a GaAs substrate.

The present invention also aims at providing a semiconductor laser for optical communication which obviates a need for temperature control in a less expensive manner by use of GaInNAs, as well as providing a transistor of high trans conductance or a high-power high-frequency integrated circuit.

The above objects of the present invention are attained by a following method of forming a GaInNAs layer.

According to one aspect of the present invention, in the method of forming a GaInNAs layer on a substrate, thallium is caused to adhere to the substrate. GaInNAs crystal is caused to grow on the substrate after adhesion of thallium.

According to another aspect of the present invention, in the method of forming a GaInNAs layer on a substrate, GaInNAs crystal is caused to grow on the substrate by means of simultaneously supplying material gas to be used for forming the GaInNAs layer and thallium.

Other objects and further features of the present invention will be apparent from the following detailed description when read in conjunction with the accompanying drawings.

DETAILED DESCRIPTION OF THE PREFERRED EMBODIMENTS

Figure 1:
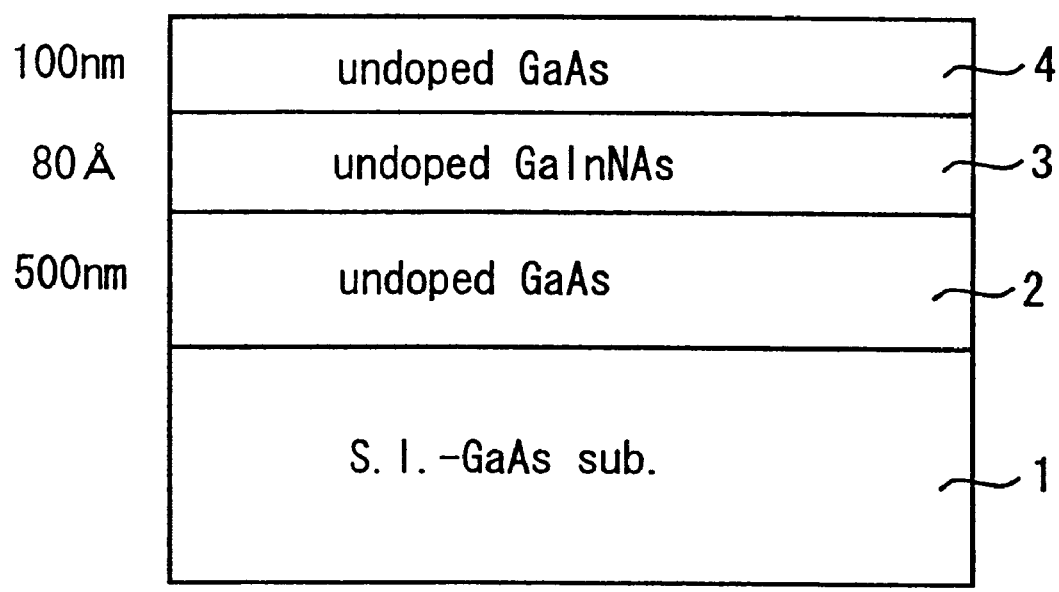
FIG. 1 is a cross-sectional view for describing a method of manufacturing an optical semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

FIG. 1 is a cross-sectional view for describing a method of manufacturing an optical semiconductor device according to a first embodiment of the present invention. In the first embodiment, a GaInNAs quantum well structure is formed through use of a GaAs substrate by means of molecular beam epitaxy (MBE).

First, a GaAs substrate 1 is heated to a growth temperature of GaAS: that is, 590° C., thus causing an undoped GaAs layer 2 to grow on the GaAs substrate 1 by 0.5 $\mu$m.

Next, the temperature of the GaAs substrate 1 is lowered to a temperature of 470° C., at which temperature GaInNAs grows. In this state, thallium (Tl) is supplied, thus causing thallium to adhere to the GaAs layer 2 to a thickness corresponding to, e.g., three atomic layers. After supply of thallium is halted, an undoped GaInNAs layer 3 is caused to grow on the undoped GaAs layer 2 by 80 angstroms. Here, solid thallium is used as raw material of thallium, and the solid thallium is heated and evaporated by means of an ordinary molecular cell. The resultant molecular beam is supplied to the substrate 1. In the GaInNAs layer 3, a composition ratio of In is set to a value of 0.35, and a composition ratio of N is set to a value of 0.05.

The GaAs substrate 1 is heated again up to a temperature of 590° C., and the undoped GaAs lyaer 4 is grown by 100 nm.

Subsequently, the temperature of the GaAs substrate 1 is lowered to room temperature.

Through the foregoing processes, a GaInNAs quantum well structure is formed on the GaAs substrate 1.

Figure 2:
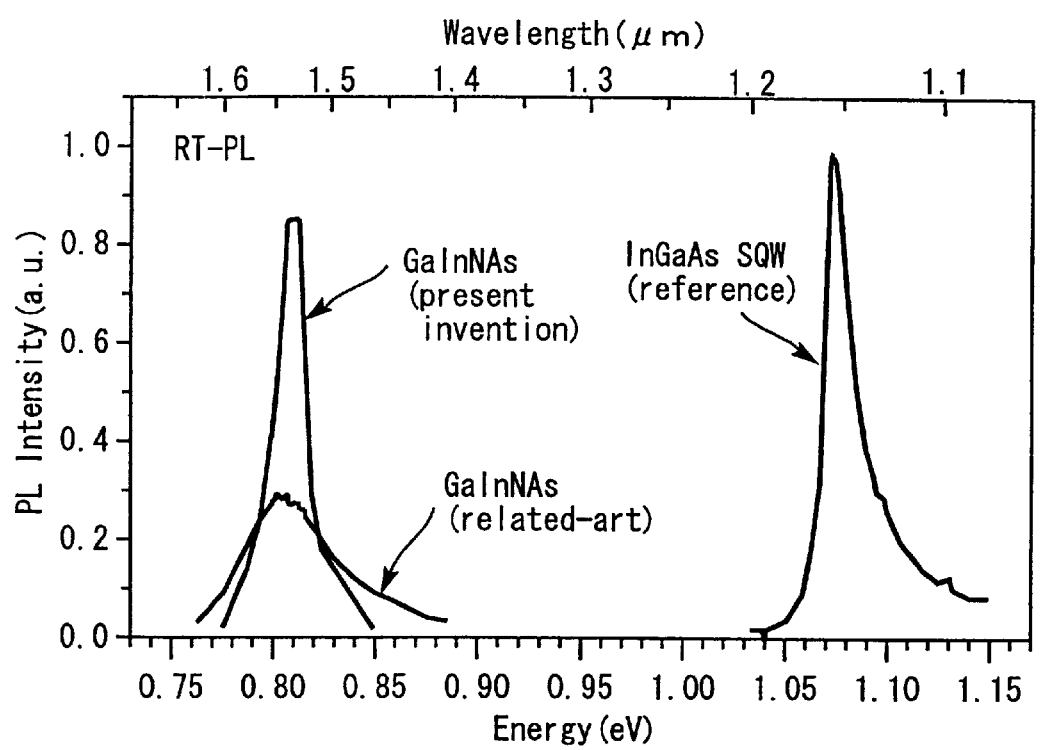
FIG. 2 is a plot for describing a result of photoluminescence evaluation of the GaInNAs quantum well structure.

FIG. 2 is a plot for describing a result of photoluminescence evaluation of the GaInNAs quantum well structure formed by the foregoing method.

For the convenience of comparison and reference, an evaluation result of an InGaAs quantum well structure and an evaluation result of a related-art GaInNAs quantum well structure (for which thallium has not been supplied) are also provided along with the evaluation result of GaInNAs quantum well structure.

As shown in FIG. 2, the evaluation result of the InGaAs quantum well structure shows luminescence arising at a wavelength of 1.15 $\mu$m. Accordingly, there cannot be obtained luminescence at a wavelength of 1.3 to 1.55 $\mu$m to be utilized for optical communication. The luminescence has been ascertained to be inapplicable to laser communication.

The evaluation result of the related-art GAInNAs quantum well structure shows luminescence arising at a wavelength of 1.55 $\mu$m, and the luminescence has been ascertained to be applicable for laser communication. However, the spectrum of the related-art GaInNAs quantum well structure has a wide half-width, and the luminescence has a low intensity. The crystal quality is insufficient, and it has been ascertained that difficulty is encountered in realizing laser of low threshold-value current.

In contrast, the evaluation result of the GaInNAs quantum well structure according to the present invention in which thallium is caused to adhere to a substrate to a thickness corresponding to three atomic layers shows a sufficiently-narrow half-width and high luminous intensity. Thus, a significant improvement in the crystalline quality of GaIn-NAs has been ascertained. In other words, the GaInNAs crystal is ascertained to have good quality.

The luminous wavelength can be adjusted by means of adjusting a composition ratio of N and can be sufficiently controlled within a range of 1.3 $\mu$m to 1.55 $\mu$m.

An improvement in the quality of GaInNAs crystal stemming from supply of thallium will now be described by reference to FIGS. 3A and 3B.

Figure 3A:
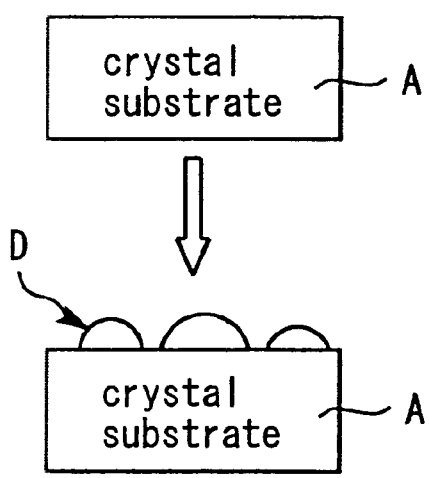
FIG. 3A is a conceptual view for describing a film growth without using a surfactant.
Figure 3B:
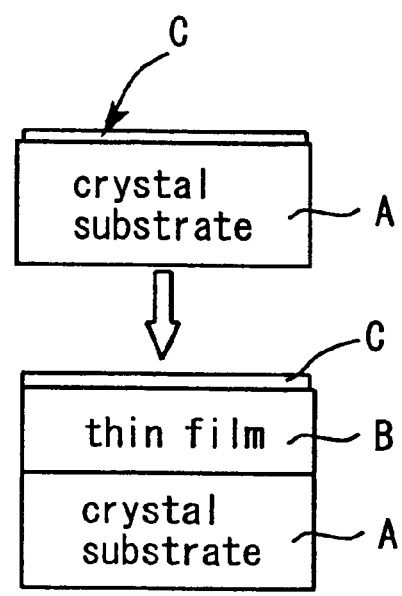
FIG. 3B is a conceptual view for describing surfactant epitaxy.

As shown in FIG. 3A, in a case where GaInNAs crystal is grown on a GaAs substrate (crystal substrate A), a growth mode usually changes from layer-shaped growth to island-shaped growth with an increase in the thickness of GaInNAs crystal. The reason for this is that, as a result of an increase in the distortion energy accumulated in a growth interface, the sum of surface energy of a growth layer and interface energy becomes greater than the surface energy of the substrate. Eventually, a layer shape becomes unstable in terms of energy. Hence, a thin film which has become unstable in terms of energy transforms into a spherical surface, which is a more stable state, thus attempting to maintain a stable state by means of rendering as large a substrate surface as possible exposed. In this way, the growth mode changes to island-shaped growth with an increase in the thickness of the growth layer. More specifically, a thin film island D of GaInNAs is formed on a GaAs substrate A. During island-shaped growth, the flatness of the surface is deteriorated, thus posing difficulty in forming an abrupt hetero interface. Further, low crystal quality of GaInNAs poses another difficulty in obtaining laser of low threshold-value current.

A technique for improving the situation is what is called surfactant epitaxy. Here, as shown in FIG. 3B, the surfactant epitaxy is a technique of supplying atoms C which are not involved in the growing thin film B and constantly remain segregated on the surface of the film to the substrate A in advance and then growing a desired thin film. The atoms C that remain surface segregated are called surfactants.

Surfactants are not involved into a growing crystal, and the surfactants remain segregated on the surface at all times even when the thickness of the crystal has increased as a result of a progress in growth. If surfactant atoms are appropriately selected, the surface energy of the thin film can be reduced considerably, thereby preventing occurrence of a transition of growth mode to island-shaped growth. Moreover, certain kinds of surfactants have an effect of suppressing a surface diffusion length of growing atom, thus preventing three-dimensional growth. Arsenic(As), antimony(Sb),bismuth(Bi), and the like atoms have already been ascertained to serve as effective surfactants at the time of growth of germanium (Ge) on the silicon substrate. Moreover, at the time of growth of InGaAs crystal on GaAs, tellurium (Te) has been ascertained to become an effective surfactant. A surfactant effective for suppressing three-dimensional growth changes according to the nature of crystal to be grown into a thin film. For this reason, even a person skilled in the art cannot readily infer an effective surfactant from analogy.

The inventor has first found that thallium (Tl) acts as a surfactant effective for inhibiting three-dimensional growth at the time of growth of GaInNAs crystal. More specifically, supplying thallium to the GaAs substrate 1 as a surfactant enables inhibition of three-dimensional growth of GaInNAs crystal and formation of an abrupt hetero interface. Accordingly, use of thallium as a surfactant enables growth of good-quality GaInNAs crystal on the GaAs substrate.

In the first embodiment, the crystal is grown by use of the molecular beam epitaxy (MBE method). However, the method is not limited to this method. There may also be employed a metal organic chemical vapor deposition (MOCVD)technique. In this case, an organic metal material, such as methylcyclopentadienylthallium[$Tl(CH_3C_5H_4)_2$], is used as raw material in place of the solid thallium, and thallium is supplied to the substrate 1 through bubbling. There may also be employed a chemical beam epitaxy (CBE) method or a gas source molecular beam epitaxy (GSMBE) method.

Either method yields the same effect as that yielded when the MBE method is employed.

In the first embodiment, a GaAs substrate is used as a substrate. However, an InP substrate may also be employed. Even in this case, there is yielded the same effect as that mentioned previously (the same also applies to second through seventh embodiments, which will be described later).

In the first embodiment, thallium is added by only a thickness corresponding to three atomic layers. However, the thickness of thallium is not limited to this. The only requirement is that thallium be caused to adhere to a thickness corresponding to at least one atomic layer, in accordance with growth conditions. More specifically, the amount of thallium to be caused to adhere to the substrate 1 is preferably determined beforehand, such that thallium remains to a thickness corresponding to at least one atomic layer on a growth surface even if progress has been made in evaporation of thallium existing on the surface of GaInNAs. As a result, thallium can be present on the growth surface at all times of growth of GaInNAs crystal. If a growing film is thin, a sufficient effect is yielded by means of causing thallium to adhere to a thickness corresponding to one atomic layer. In contrast, if a growth temperature is high, thallium of several atomic layers is required.

Second Embodiment

The first embodiment has described that thallium having a thickness corresponding to three atomic layers is caused to adhere to the GaAs substrate 1. A second embodiment is characterized in that thallium is not caused to adhere to the substrate before growth of the GaInNAs crystal and that a material gas and thallium are supplied simultaneously at the time of growth of a GaInNAs crystal.

In the first embodiment, thallium that has been supplied to the GaAs substrate 1 beforehand evaporates immediately, because thallium has a nature of evaporating very readily. As a result, thallium remains on the surface of the substrate 1 to a thickness corresponding to only one atomic layer. As time elapses, the thus-remaining thallium having a thickness of one atomic layer gradually evaporates. Hence, the first embodiment is not inappropriate for growing thick GaInNAs crystal or for crystal growth involving consumption of time (a growth time).

As in the case of the second embodiment, if the material gas required for growing crystal and thallium (Tl) are supplied simultaneously to a processing chamber of an epitaxial system (or an MOCVD system) at the time of growth of GaInNAs crystal, a reduction in the amount of thallium existing on a growth surface can be suppressed. Accordingly, thallium serving as surfactants can be supplied to the growth surface at all times. As a result, three-dimensional (island-shaped) growth of GaInNAs crystal is inhibited, thus enabling layer-shaped growth of GaInNAs crystal and formation of an abrupt hetero interface.

Evaporation of thallium is abruptly accelerated at a temperature of 500° C. or more. Accordingly, if there is a necessity for setting a high growth temperature; for example, if crystal is caused to grow at a temperature of 500° C. or more, the second embodiment is very effective. The amount of thallium to be supplied is optimized in association with a growth temperature. More specifically, if a growth temperature is high, there is a necessity for supplying a larger amount of thallium. The amount of thallium to be supplied is desirably optimized within a range of 2% to 50% with reference to the amount of gallium (Ga), which is one of material gases.

Third Embodiment

The first and second embodiments have described an example in which the method of growing GaInNAs crystal (i.e., the method for forming a GaInNAs layer) is applied to formation of a single quantum well structure.

In the third embodiment, the method of growing a GaInNAs crystal according to the first or second embodiment is applied to a multilayer structure having GaInNAs layer, for example, a multiple quantum well structure or a superlattice structure such as GaInNAs/GaNAs or GaInNAs/AlGaAs.

Even in this case, three-dimensional growth of GaInNAs crystal can be suppressed by means of action of thallium, and hence GaInNAs crystal of good quality can be produced. Accordingly, an abrupt hetero interface can be formed. By means of forming GaInNAs crystal through use of the method described in connection with the second embodiment, GaInNAs crystal of good quality can be produced even when a growth temperature is high.

Preferably, the method of growing GaInNAs crystal described in connection with the first or second embodiment is applied to growth of only a nitrogen-containing layer, such as GaInNAs or GaNAs.

Fourth Embodiment

Figure 4:
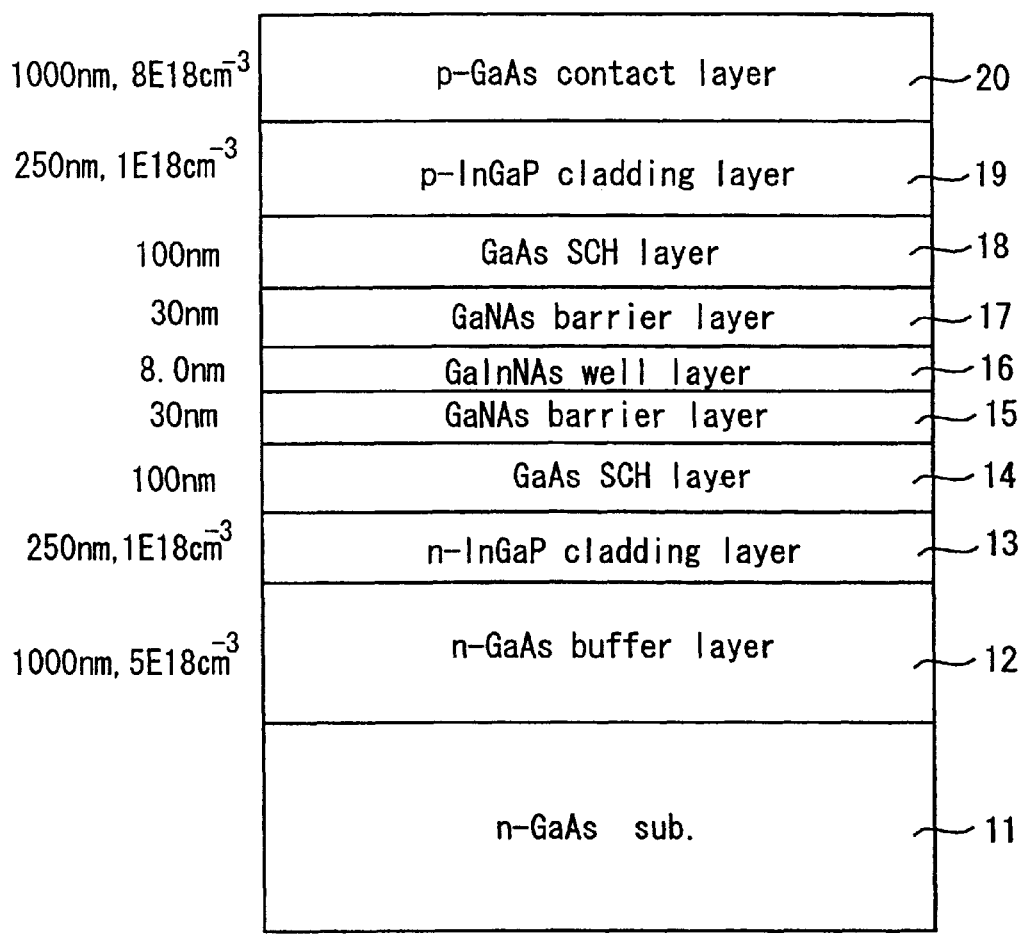
FIG. 4 is a cross-sectional view for describing the structure of a semiconductor laser according to a fourth embodiment of the present invention.

FIG. 4 is a cross-sectional view for describing the structure of a semiconductor laser according to a fourth embodiment of the present invention.

In FIG. 4, reference numeral 11 designates an n-GaAs substrate; 12 designates an n-GaAs buffer layer (having a thickness of 1000 nm and a dosage of 5E18 $cm^{-3}$); 13 designates an n-InGaP cladding layer (having a thickness of 250 nm and a dosage of 1E18 $cm^{-3}$); 14 designates a GaAs SCH layer (having a thickness of 100 nm); 15 designates a GaNAs barrier layer (having a thickness of 30 nm); 16 designates a GaInNAs well layer (having a thickness of 8.0 nm); 17 designates a GaNAs barrier layer (having a thickness of 30 nm); 18 designates a GaAs SCH layer (having a thickness of 100 nm); 19 designates a p-InGaP cladding layer (having a thickness of 250 nm and a dosage of 1E18 cm$^{-3}$); and 20 designates a p-GaAs contact layer (having a thickness of 1000 nm and a dosage of 8E18 cm$^{-3}$).

The semiconductor laser according to a fourth embodiment has a multilayer structure in which, on the n-GaAs substrate 11 there are sequentially stacked, in the order given, the n-GaAs buffer layer 12, the n-InGaP cladding layer 13, the GaAs SCH layer 14, the GaNAs barrier layer 15, the GaInNAs well layer 16, the GaNAs barrier layer 17, the GaAs SCH layer 18, the p-InGaP cladding layer 19, and the p-GaAs contact layer 20.

The molecular bream epitaxy (MBE) method is employed for growing the respective layers. Further, the GaInNAs well layer 16 and the GaNAs barrier layers 15 and 17 are grown by use of the method described in connection with the second embodiment; that is, a method of growing crystal involving simultaneous supply of material gas and thallium. The amount of thallium (Tl) to be supplied is set to 5% the amount of gallium (Ga) to be supplied.

The semiconductor laser described in connection with the fourth embodiment uses GaInNAs for the well layer 16. Here, the well layer 16 is an active layer or region. In relation to the GaInNAs well layer 16, the composition ratio of In is set to 0.38, and the composition ratio of N is set to 0.01.

In relation to the semiconductor laser having such a crystalline structure, a broad-area laser is prototyped by means of forming an n-electrode and a p-electrode, and the thus-produced laser is evaluated. The results of evaluation show continuous oscillation at an oscillation wavelength of 1.31 μm. Moreover, the characteristic temperature of the thus-prototyped broad area laser is measured. The thus-measured characteristic temperature T0=160K is ascertained to be higher than a characteristic temperature T0=60K of a typical InGaAsP-based laser, and low temperature dependence is also ascertained.

According to the fourth embodiment, good-quality GaInNAs is applied to the well layer 16 of the semiconductor laser. As a result, a semiconductor laser for optical communication that previously has been realized only on an expensive InP substrate can be embodied on the GaAs substrate 11 which is less expensive and can be made larger in diameter. Further, the semiconductor laser according to the fourth embodiment has a superior temperature characteristic, and hence a temperature controller is obviated. Accordingly, use of the semiconductor laser mentioned above enables a significant reduction in the cost of a communication system.

Fifth Embodiment

Figure 5:
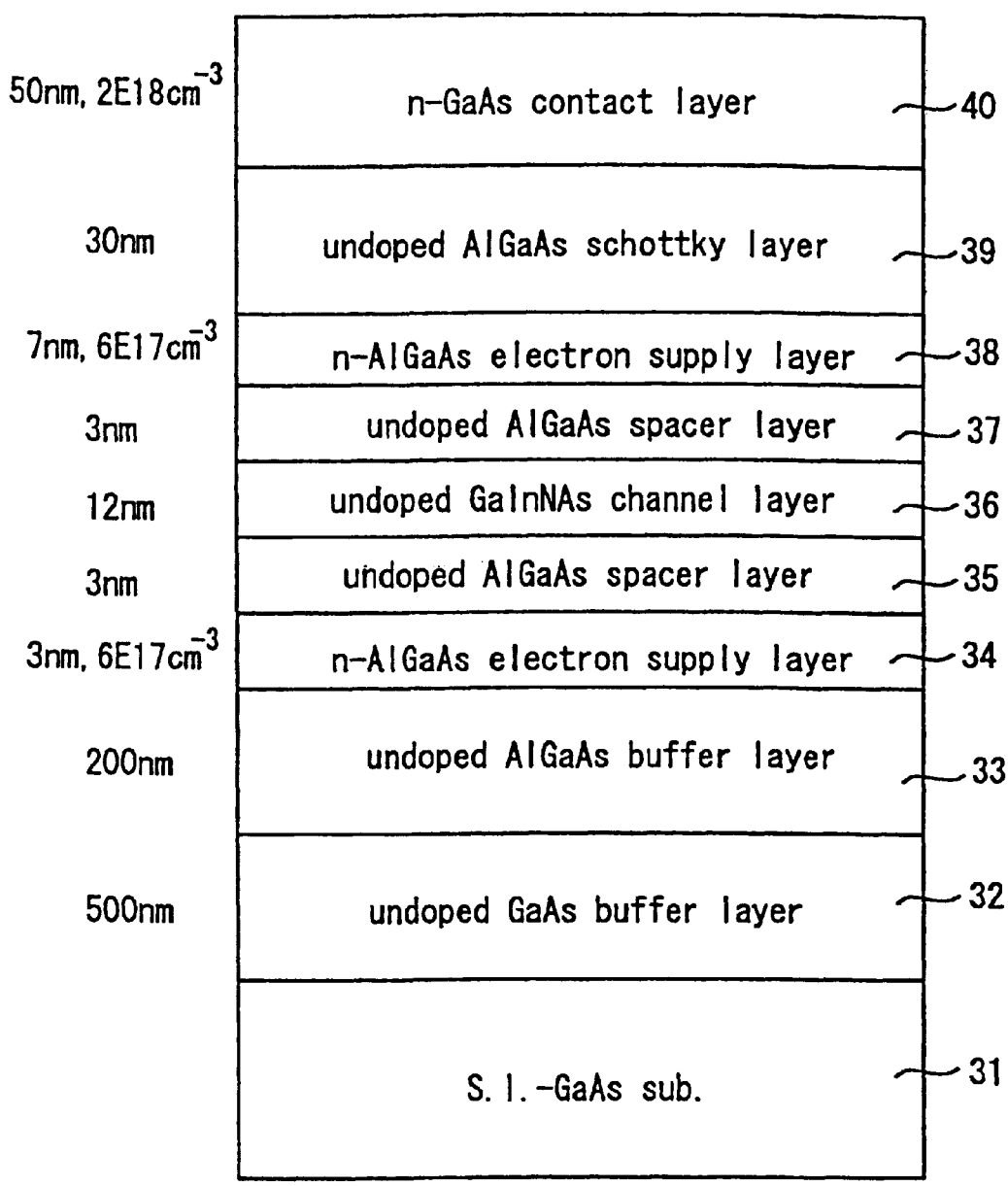
FIG. 5 is a cross-sectional view for describing the structure of a high electron mobility transistor (HEMT) according to a fifth embodiment of the present invention.

FIG. 5 is a cross-sectional view for describing the structure of a high electron mobility transistor (HEMT) according to a fifth embodiment of the present invention.

In FIG. 5, reference numeral 31 designates a GaAs substrate; 32 designates an undoped GaAs buffer layer (having a thickness of 500 nm); 33 designates an undoped AlGaAs buffer layer (having a thickness of 200 nm); 34 designates an n-AlGaAs electron supply layer (having a thickness of 3 nm and a dosage of 6E17 cm$^{-3}$); 35 designates an undoped AlGaAs spacer layer (having a thickness of 3 nm): 36 designates an undoped GaInNAs channel layer (having a thickness of 12 nm); 37 designates an undoped AlGaAs spacer layer (having a thickness of 3 nm); 38 designates an n-AlGaAs electron supply layer (having a thickness of 7 nm and a dosage of 6E17 cm$^{-3}$); 39 designates an undoped AlGaAs shottky layer (having a thickness of 30 nm); and 40 designates an n-GaAs contact layer (having a thickness of 50 nm and a dosage of 6E17 cm$^{-3}$).

The high electron mobility transistor (hereinafter often called simply "HEMT") according to the fifth embodiment; more specifically, a substrate to be used for fabricating an HEMT, has a structure in which on the GaAs substrate 31 are sequentially formed the undoped GaAs buffer layer 32, the undoped AlGaAs buffer layer 33, the n-AlGaAs electron supply layer 34, the undoped AlGaAs spacer layer 35, the undoped GaInNAs channel layer 36, the undoped AlGaAs spacer layer 37, the n-AlGaAs electron supply layer 38, the undoped AlGaAs shottky layer 39, and the n-GaAs contact layer 40.

An HEMT device is completed on the epitaxial wafer shown in FIG. 5 through processes for forming a gate electrode, a source electrode, and a drain electrode.

The high electron mobility transistor according to the fifth embodiment is characterized in that a good-quality GaInNAs to be produced under the method described in connection with the second embodiment is applied to the channel layer 36 (or an area in the vicinity of the channel layer). The other layers are grown by means of the MOCVD method. Further, in relation to the undoped GaInNAs channel layer 36, the composition ratio of In is set to 0.2, and the composition ratio of N is set to 0.01.

The remaining layers are substantially identical in structure with those of an ordinary InGaAs-based pHEMT, and hence their explanations are omitted.

According to the fifth embodiment, GaInNAs is used for the channel layer in lieu of related-art InGaAs. As a result, there can be ensured large band discontinuity in a two-dimensional electron gas interface. Consequently, Ns can be increased from Ns=2.0E12 cm$^{-2}$, which has been available in the related art, to Ns=3.2E12 cm$^{-2}$. An output of the HEMT can be increased from P=0.3 W/mm, which has been available in the related art, to P=0.6 W/mm. More specifically, a high-power HEMT device is obtained. Moreover, a transistor having high mutual conductance (gm) is obtained.

Sixth Embodiment

Figure 6:
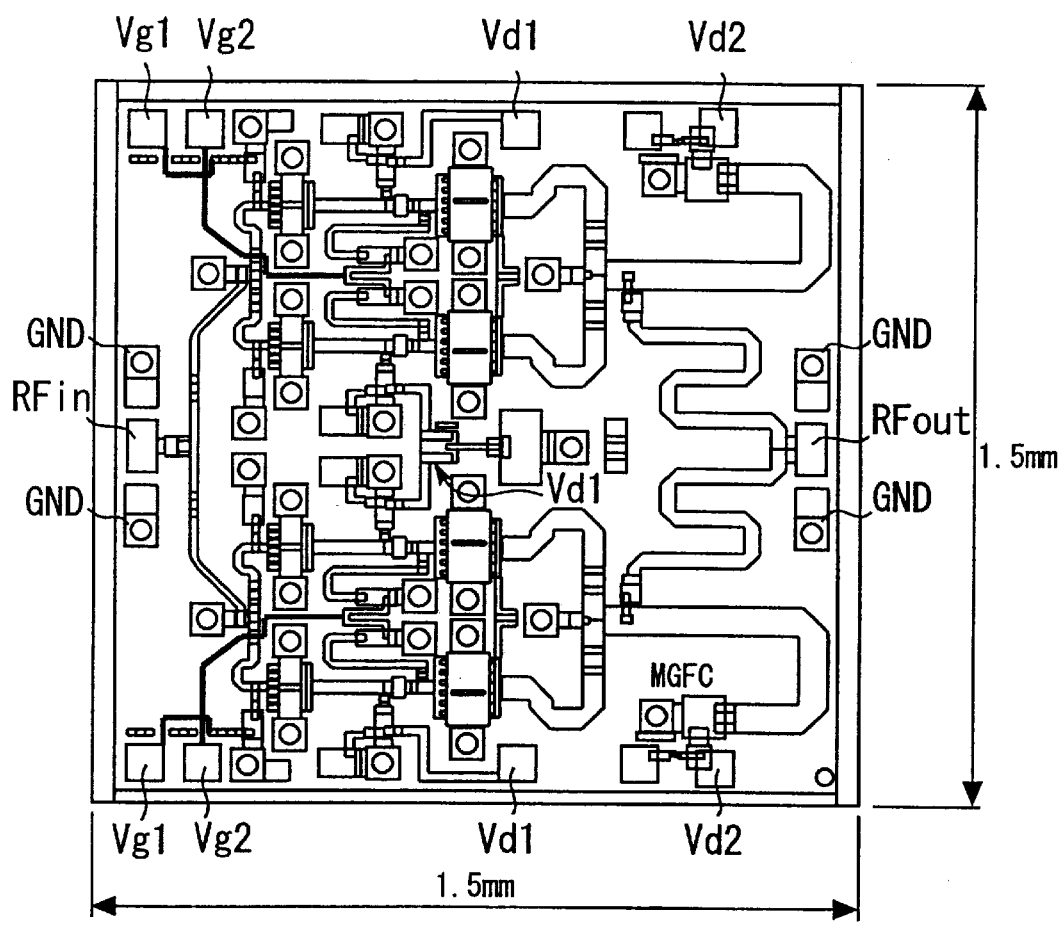
FIG. 6 is an illustration describing a circuit pattern of a high-frequency integrated circuit according to a sixth embodiment of the present invention.

FIG. 6 is an illustration describing a circuit pattern of a high-frequency integrated circuit according to a sixth embodiment of the present invention. By way of an example of a high-frequency integrated circuit, a monolithic microwave integrated circuit (MMIC) will now be described.

The MMIC according to the sixth embodiment employs the high electron mobility transistor (HEMT) described in connection with the fifth embodiment as a basic transistor.

The MMIC is a high-power MMIC for transmission/receiving purposes which operates in a 30 GHz range and yields the following superior characteristics. The MMIC yields an output of 32 dBm and has a linear gain of 30 dB, a power efficiency of 45%, and an input and output return loss of −15 dB.

The characteristic cannot be achieved unless the InP-based HEMT is employed as a related-art basic transistor. Fabrication of such a high-performance MMIC on the GaAs substrate yields a great impact. The present invention enables low-cost fabrication of a high-performance/high-power MMIC, thus significantly curtailing the cost of a transceiver system for point-to-multipoint communication.

According to the sixth embodiment, the MMIC having the foregoing characteristic can be integrated into a chip measuring 1.5 mm×1.5 mm. Accordingly, a more compact MMIC can be embodied.

Seventh Embodiment

Figure 7:
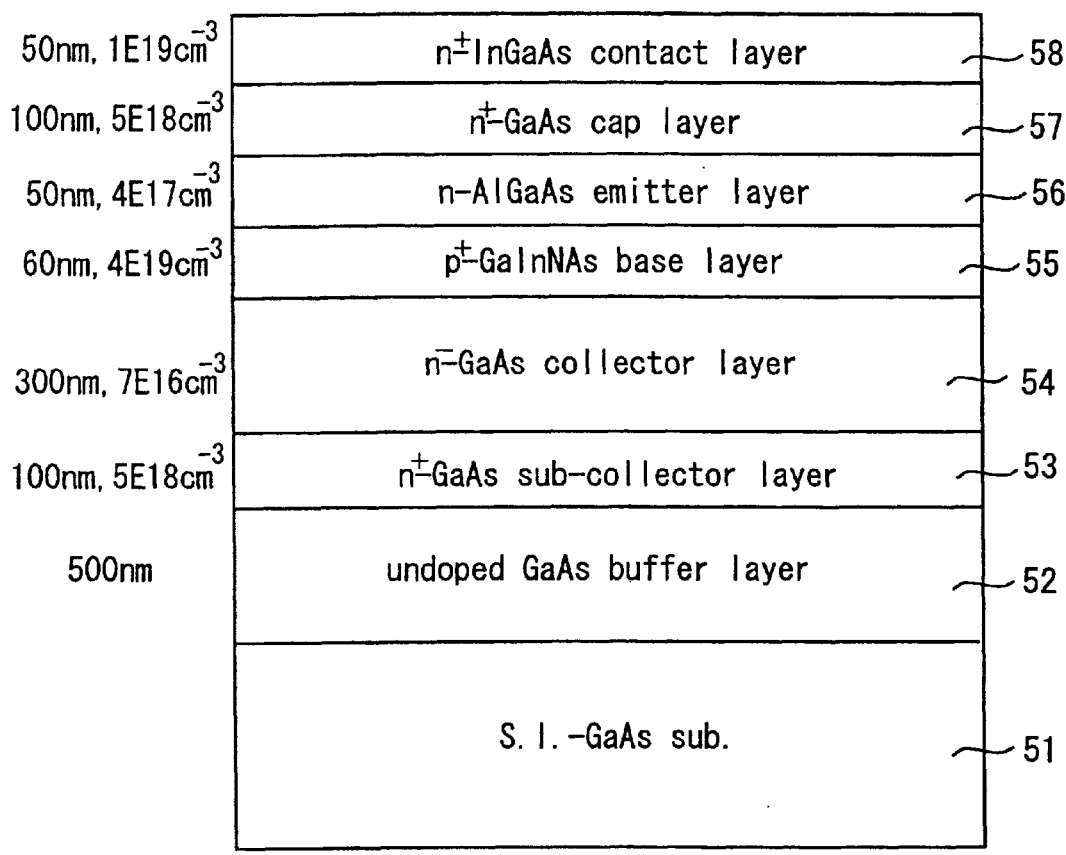
FIG. 7 is a cross-sectional view for describing the structure of a heterojunction bipolar transistor according to a seventh embodiment of the present invention.

FIG. 7 is a cross-sectional view for describing the structure of a heterojunction bipolar transistor (HBT) according to a seventh embodiment of the present invention.

In FIG. 7, reference numeral 51 designates a GaAs substrate; 52 designates an undoped GaAs buffer layer (having a thickness of 500 nm); 53 designates an n$^+$-GaAs sub-collector layer (having a thickness of 100 nm and a dosage of 5E18 cm$^{-3}$); 54 designates an n$^-$-GaAs collector layer (having a thickness of 300 nm and a dosage of 7E16 cm$^{-3}$); 55 designates a p$^+$-GaInNAs base layer (having a thickness of 60 nm and a dosage of 4E19 cm$^-$); 56 designates an nAlGaAs emitter layer (having a thickness of 50 nm and a dosage of 4E17 cm$^-$); 57 designates an n$^+$-GaAs cap layer (having a thickness of 100 nm and a dosage of 5E18 cm$^{-3}$); and 58 designates an n$^+$-InGaAs contact layer (having a thickness of 50 nm and a dosage of 1E19 cm$^{-3}$).

In contrast with a related-art GaAs/AlGaAs-HBT, the heterojunction bipolar transistor (hereinafter also called "HBT") according to the seventh embodiment; that is, a substrate (epitaxial wafer) to be used for fabricating an HBT, is characterized in that GaInNAs is used for the base layer 55 (or an area in the vicinity of the base layer).

In the seventh embodiment, the respective layers of crystal are grown by use of the MOCVD method. Further, the p$^+$-GaInNAs base layer 55 is grown by use of the method described in connection with the second embodiment.

The characteristic of the HBT according to the seventh embodiment was evaluated, whereby the operating current could be curtailed by 20% and a DC gain (efficiency) could be improved by 60%. According to the seventh embodiment, performance equivalent or higher than that of a so-called InP-HBT fabricated on an InP substrate can be achieved by an HBT fabricated on a low-cost and large-diameter GaAs substrate. Hence, the costs of the HBT and that of a communication system can be diminished.

The HBT produced in the seventh embodiment may be used in place of an HEMT in the MMIC according to the sixth embodiment.

This invention, when practiced illustratively in the manner described above, provides the following major effects:

According to the present invention, a good quality GaInNAs crystal can be grown on the GaAs substrate. As a result, a laser for optical communication in the range of 1.3 $\mu$m can be fabricated on the GaAs substrate. Accordingly, a semiconductor laser for optical communication which obviates a necessity of temperature control can be provided at low cost. Moreover, a transistor of high mutual conductance or a high-power high-frequency integrated circuit can be provided.

Further, the present invention is not limited to these embodiments, but variations and modifications may be made without departing from the scope of the present invention.

The entire disclosure of Japanese Patent Application No. 2001-352842 filed on Nov. 19, 2001 containing specification, claims, drawings and summary are incorporated herein by reference in its entirety.

What is claimed is:

1. A method of forming a GaInNAs layer on a substrate comprising:
    adhering thallium to a substrate; and
    growing crystalline GaInNAs on the thallium adhered to the substrate.

2. The method of forming a GaInNAs layer according to claim 1, including adhering the thallium to the substrate in a thickness of at least one atomic layer.

3. The method of forming a GaInNAs layer according to claim 2, including epitaxially growing the crystalline GaInNAs.

4. The method according to claim 2, including growing the crystalline GaInNAs by chemical vapor deposition.

5. The method of forming a GaInNAs layer according to claim 1, including epitaxially growing the crystalline GaInNAs.

6. The method according to claim 1, wherein the substrate is a GaAs substrate.

7. The method according to claim 1, wherein the substrate is an InP substrate.

8. The method according to claim 1, including growing the crystalline GaInNAs by chemical vapor deposition.

9. A method of forming a GaInNAs layer on a substrate comprising:
    growing crystalline GaInNAs on a substrate by simultaneously supplying source gases for forming the GaInNAs and thallium to the substrate.

10. The method according to claim 9, including epitaxially growing the crystalline GaInNAs.

11. The method according to claim 10, including supplying gallium to the substrate and supplying thallium in an amount of 2 to 50% of the gallium supplied.

12. The method according to claim 9, including supplying gallium to the substrate and supplying thallium in an amount of 2 to 50% of the gallium supplied.

13. The method according to claim 9, wherein the substrate is a GaAs substrate.

14. The method according to claim 9, wherein the substrate is an InP substrate.

15. The method according to claim 9, including growing the crystalline GaInNAs by chemical vapor deposition.

16. The method according to claim 15, including supplying gallium to the substrate and supplying thallium in an amount of 2 to 50% of the gallium supplied.

* * * * *